US010655643B2

(12) United States Patent
Miwa

(10) Patent No.: US 10,655,643 B2
(45) Date of Patent: May 19, 2020

(54) COOLING DEVICE, GUARD UNIT, AND SERVER

(71) Applicant: NEC Platforms, Ltd., Kawasaki-shi, Kanagawa (JP)

(72) Inventor: Tomoki Miwa, Kawasaki (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 613 days.

(21) Appl. No.: 15/333,015

(22) Filed: Oct. 24, 2016

(65) Prior Publication Data

US 2017/0114803 A1 Apr. 27, 2017

(30) Foreign Application Priority Data

Oct. 26, 2015 (JP) ................................ 2015-209990

(51) Int. Cl.

*F04D 29/70* (2006.01)
*F04D 25/06* (2006.01)
*F04D 29/60* (2006.01)
*H05K 7/20* (2006.01)
*F04D 19/00* (2006.01)

(Continued)

(52) U.S. Cl.

CPC .......... *F04D 29/703* (2013.01); *F04D 13/06* (2013.01); *F04D 19/007* (2013.01); *F04D 25/0613* (2013.01); *F04D 25/166* (2013.01); *F04D 29/601* (2013.01); *H05K 7/20145* (2013.01); *H05K 7/20172* (2013.01); *H05K 7/20581* (2013.01); *H05K 7/20727* (2013.01)

(58) Field of Classification Search

CPC .... F04D 29/703; F04D 19/007; F04D 25/166; F04D 29/601; F04D 25/0613; F04D 13/06; H05K 7/20581; H05K 7/20145; H05K 7/20172; H05K 7/20727

See application file for complete search history.

(56) References Cited

U.S. PATENT DOCUMENTS 2,100,994 A * 11/1937 Cohen .................. F04D 29/703 415/121.2
2,453,009 A * 11/1948 Ganger ................ F04D 29/703 416/244 R (Continued)

FOREIGN PATENT DOCUMENTS

JP 2-103198 8/1990
JP 8 46380 2/1996

(Continued)

OTHER PUBLICATIONS

Japanese Office Action dated Sep. 6, 2016, by the Japanese Patent Office in counterpart Japanese Patent Application No. 2015-209990.

*Primary Examiner* — Dwayne J White
*Assistant Examiner* — Adam W Brown
(74) *Attorney, Agent, or Firm* — Finnegan, Henderson, Farabow, Garrett & Dunner, L.L.P.

(57) ABSTRACT

A cooling device includes a fan; an intake-side intrusion-preventing member that is provided on an intake side of the fan and prevents an object from entering the fan; an exhaust-side intrusion-preventing member that is provided on an exhaust side of the fan and prevents an object from entering the fan. The intake-side intrusion-preventing member and the exhaust-side intrusion-preventing member have different shapes.

11 Claims, 8 Drawing Sheets

(51) Int. Cl.
*F04D 25/16* (2006.01)
*F04D 13/06* (2006.01)

(56) References Cited

U.S. PATENT DOCUMENTS 4,365,930 A * 12/1982 Ogura .................... F04D 25/10 415/61
6,722,971 B2 * 4/2004 Gough ...................... G06F 1/20 361/695
7,011,504 B2 * 3/2006 Seo ....................... F04D 29/703 415/121.2
7,118,333 B2 * 10/2006 Takemoto ............ F04D 29/703 415/211.2
7,184,268 B2 * 2/2007 Espinoza-Ibarra ... F04D 29/382 165/121
7,329,091 B2 * 2/2008 Yan .................... F04D 25/0613 415/191
7,442,005 B2 * 10/2008 Yeh ...................... F04D 19/002 310/401
7,654,309 B2 * 2/2010 Wu ................... H05K 7/20154 165/119
8,166,775 B2 * 5/2012 Choi ................. B60H 1/00564 181/224
2002/0159883 A1 * 10/2002 Simon .................. F04D 29/703 415/193
2012/0219427 A1 8/2012 Mao et al.
2013/0004303 A1 1/2013 Zhang et al.
2015/0004033 A1 * 1/2015 Reuter ................... F04D 25/08 417/423.14

FOREIGN PATENT DOCUMENTS

JP 2000-340974 12/2000
JP 2005-51085 2/2005
JP 2013-21063 1/2013

* cited by examiner

COOLING DEVICE, GUARD UNIT, AND SERVER

BACKGROUND OF THE INVENTION

Field of the Invention

The present invention relates to a cooling device, a guard unit, and a server.

Description of the Related Art

In a known device (e.g., server) having a plurality of built-in modules which are electronic devices in its housing, a fan may be provided to perform ventilation in the housing so as to cool the electronic devices. For such a fan, it is necessary to prevent a foreign object from entering the fan by being sucked thereinto due to a generated airflow and to prevent a user's fingers, hands, tools and the like from erroneously entering the fan. For example, Patent Document 1 discloses a fan unit in which intrusion-preventing members (finger guards) are provided before and after the ventilation passage.

Patent Document 1: Japanese Unexamined Patent Application, First Publication No. 2005-51085.

In the fan unit disclosed in Patent Document 1, intrusion-preventing members having the same structure are provided on the intake and exhaust sides of the fan. However, the intake and exhaust sides of a fan require different functions, characteristics, and the like.

SUMMARY OF THE INVENTION

An object of the present invention is to provide a cooling device, a guard unit, and a server, by which the intake and exhaust sides of a fan can have individual intrusion-preventing members whose functions, characteristics, and the like are suitable for the corresponding intake and exhaust sides of the fan.

Therefore, the present invention provides a cooling device comprising:

a fan;

an intake-side intrusion-preventing member that is provided on an intake side of the fan and prevents an object from entering the fan;

an exhaust-side intrusion-preventing member that is provided on an exhaust side of the fan and prevents an object from entering the fan, wherein the intake-side intrusion-preventing member and the exhaust-side intrusion-preventing member have different shapes.

The present invention also provides a guard unit provided on an intake-side and an exhaust-side of a fan, the guard unit comprising:

an intake-side intrusion-preventing member that is provided on an upstream side of a flow direction of a fluid generated when the fan is driven, where the intake-side intrusion-preventing member prevents an object having a size greater than or equal to a predetermined value from entering the fan;

an exhaust-side intrusion-preventing member that is provided on a downstream side of the flow direction and is spaced apart from the intake-side intrusion-preventing member, where the exhaust-side intrusion-preventing member prevents an object having a size greater than or equal to a predetermined value from entering the fan;

wherein the intake-side intrusion-preventing member and the exhaust-side intrusion-preventing member have different shapes.

The present invention also provides a server comprising the above-described cooling device.

In accordance with the cooling device, the guard unit, and the server according to the present invention, the intake and exhaust sides of a fan can have individual intrusion-preventing members whose functions, characteristics, and the like are suitable for the corresponding intake and exhaust sides of the fan.

DETAILED DESCRIPTION OF THE INVENTION

Hereinafter, embodiments of the present invention will be described with reference to the appended figures. Here, parts identical to those in the above-described conventional example are given identical names and detailed explanations thereof are omitted.

First Embodiment

Figure 1:
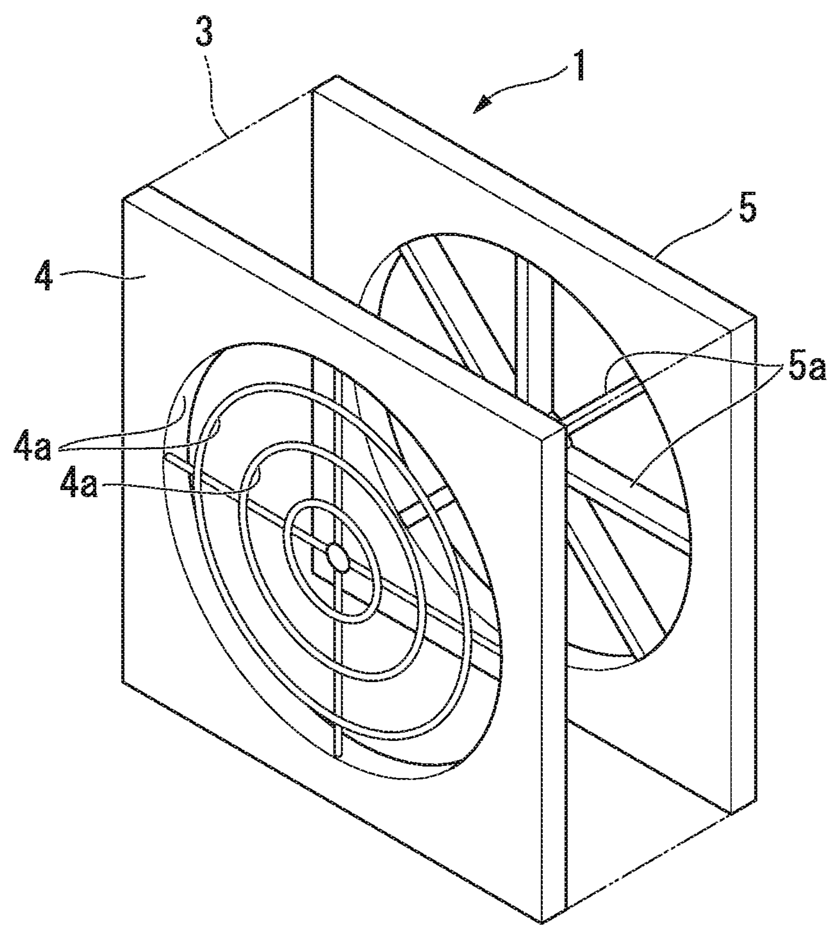
FIG. 1 is a diagram showing a minimum structure of a cooling device according to a first embodiment.

FIG. 1 is a diagram showing a minimum structure of a cooling device according to the present embodiment.

As shown in FIG. 1, a cooling device 1 has at least a fan 3, an intake-side intrusion-preventing member 4, and an exhaust-side intrusion-preventing member 5.

The fan 3 generates an airflow by using a motor which drives and rotates rotor blades.

The intake-side intrusion-preventing member 4 is provided on the intake side of the fan in a manner such that an intake portion of the fan 3 is covered with the intake-side intrusion-preventing member 4.

The exhaust-side intrusion-preventing member 5 is provided on the exhaust side of the fan in a manner such that an exhaust portion of the fan 3 is covered with the exhaust-side intrusion-preventing member 5.

The intake-side intrusion-preventing member 4 and the exhaust-side intrusion-preventing member 5 prevent an object such as a foreign object, a user's finger or hand, a tool, or the like, from entering the fan 3. Therefore, the intake-side intrusion-preventing member 4 and the exhaust-side intrusion-preventing member 5 respectively have openings 4*a* and openings 5*a* through the corresponding surfaces, where each opening has a size smaller than that of an object assumed as a target of the intrusion prevention.

The intake-side intrusion-preventing member 4 and the exhaust-side intrusion-preventing member 5 have different shapes. Here, required characteristics, characteristics given priority, or the like, differ between the intake side and the exhaust side of the fan 3. On the intake side of the fan, reduction of air passage resistance or the like may be given priority for the intake-side intrusion-preventing member 4. In contrast, on the exhaust side of the fan 3, the air passage resistance is given lower priority than the intake side if a required amount of the airflow is secured, and cost reduction, slimming, or the like, is given higher priority. Accordingly, different shapes are applied to the intake-side intrusion-preventing member 4 and the exhaust-side intrusion-preventing member 5.

Therefore, the present cooling device 1 has the fan 3, the intake-side intrusion-preventing member 4 provided on the intake side of the fan 3 so as to prevent an object from entering the fan 3, the exhaust-side intrusion-preventing member 5 provided on the exhaust side of the fan 3 so as to prevent an object from entering the fan 3, where the intake-side intrusion-preventing member 4 and the exhaust-side intrusion-preventing member 5 have different shapes.

In this structure, according to the different functions or characteristics required for the intake and exhaust sides of the fan 3, the intake-side intrusion-preventing member 4 and the exhaust-side intrusion-preventing member 5 can have different shapes. Accordingly, optimum shapes can be applied to the intake-side intrusion-preventing member 4 and the exhaust-side intrusion-preventing member 5 according to the individual functions or characteristics, which can improve the performance of the cooling device 1 and implement cost saving, downsizing, and the like.

In this embodiment, characteristics given priority for each of the intake-side intrusion-preventing member 4 and the exhaust-side intrusion-preventing member 5 are not limited, and the shape, arrangement, number, and the like of the openings 4*a* of the intake-side intrusion-preventing member 4 or the openings 5*a* of the exhaust-side intrusion-preventing member 5 are just examples and are thus not limited.

Second Embodiment

Figure 2:
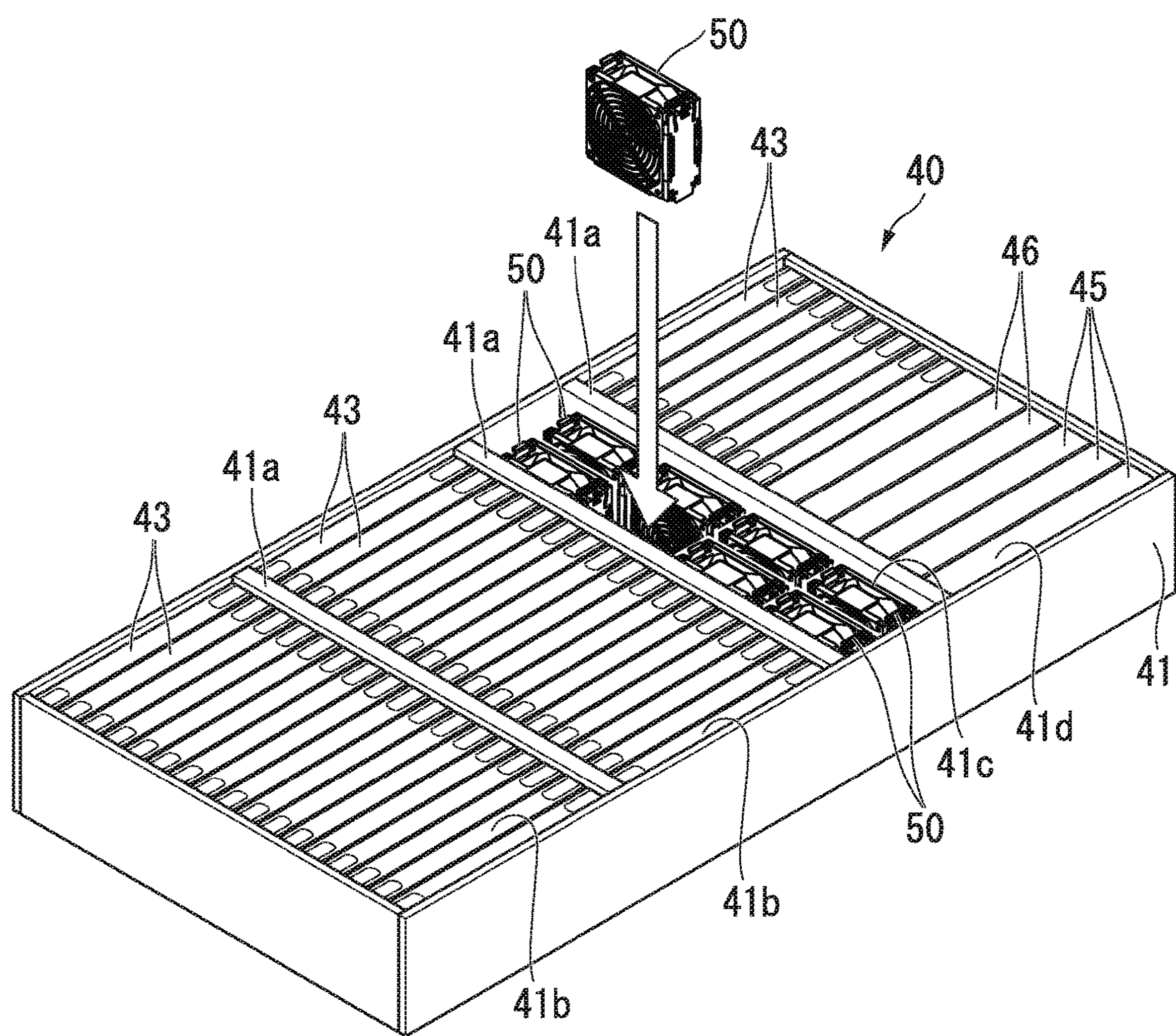
FIG. 2 is a perspective view showing an example of a server that has a cooling device and a guard unit, according to a second embodiment.

FIG. 2 is a perspective view showing an example of a server that as a cooling device and a guard unit, according to the present embodiment.

As shown in FIG. 2, a server 40 mainly includes a housing 41, server modules 43, fan modules 50 (cooling devices), power units 45, and communication units 46.

The housing 41 contains at least the server modules 43, the fan modules 50, the power units 45, and the communication units 46. The housing 41 opens upward, has a box shape, and has a rectangular shape in the top plan view. This housing 41 may be supported by a rack in a slidable manner in a front to rear direction. When the housing 41 contained in the rack is drawn forward, the inside of the housing 41 can be accessed. On the other hand, when the housing 41 is pushed to the back of the rack from the drawn state, the housing 41 is contained in the rack.

The housing 41 of the server 40 in the present embodiment is long in the front to rear direction, and the power units 45 are contained in a rear portion of the housing 41.

The housing 41 has partition members 41*a* utilized to partition the inner space of the housing 41 into a plurality of sections. Each partition member 41*a* has a plurality of through holes so that cooling air can flow in the front to rear direction. The housing 41 of the present embodiment is partitioned by the partition members 41*a* into server module storage parts 41*b*, a fan module storage part 41*c*, and an other-item storage part 41*d* in the order thereof starting from the front side to the rear side.

There are two server module storage parts 41*b* adjacent to each other in the front to rear direction. Each server module storage part 41*b* contains a plurality of server modules 43. Lots of the server modules 43 can be contained where the thickness direction thereof coincides with the width direction of the housing 41. In other words, each server module storage part 41*b* can contain lots of the server modules 43 in a manner such that they are stacked in their thickness direction.

The fan module storage part 41*c* is interposed between the server module storage parts 41*h* and the other-item storage part 41*d*. The fan module storage part 41*c* contains a plurality of fan modules 50. The fan modules 50 are contained in the fan module storage part 41*c* in a manner such that the direction of the rotating shaft of each fan module 50 coincides with the front to rear direction and a plurality of fan modules 50 are aligned in the width direction. The fan module storage part 41*c* in the present embodiment is arranged to form two lines in the front to rear direction so that two fan modules 50 are overlapped in the front to rear direction. Each fan module 50 generates cooling air that passes from the front side to the rear side thereof.

The other-item storage part 41*d* contains the server modules 43, the power units 45, and the communication units 46. More specifically, the other-item storage part 41*d* can contain the server modules 43 in a remaining portion after the power units 45 and the communication units 46 are contained.

Here, cables and the like of the power units 45 and the communication units 46, which are connected to devices outside the server 40, can be pulled out from the rear surface of the housing 41.

Although it is not shown in FIG. 2, in a bottom portion of the housing 41, a plurality of connectors to be electrically connected to the fan modules 50 are provided for the fan module storage part 41*c*. Electric power to drive fans is supplied via the connectors to the fan module 50.

Figure 3:
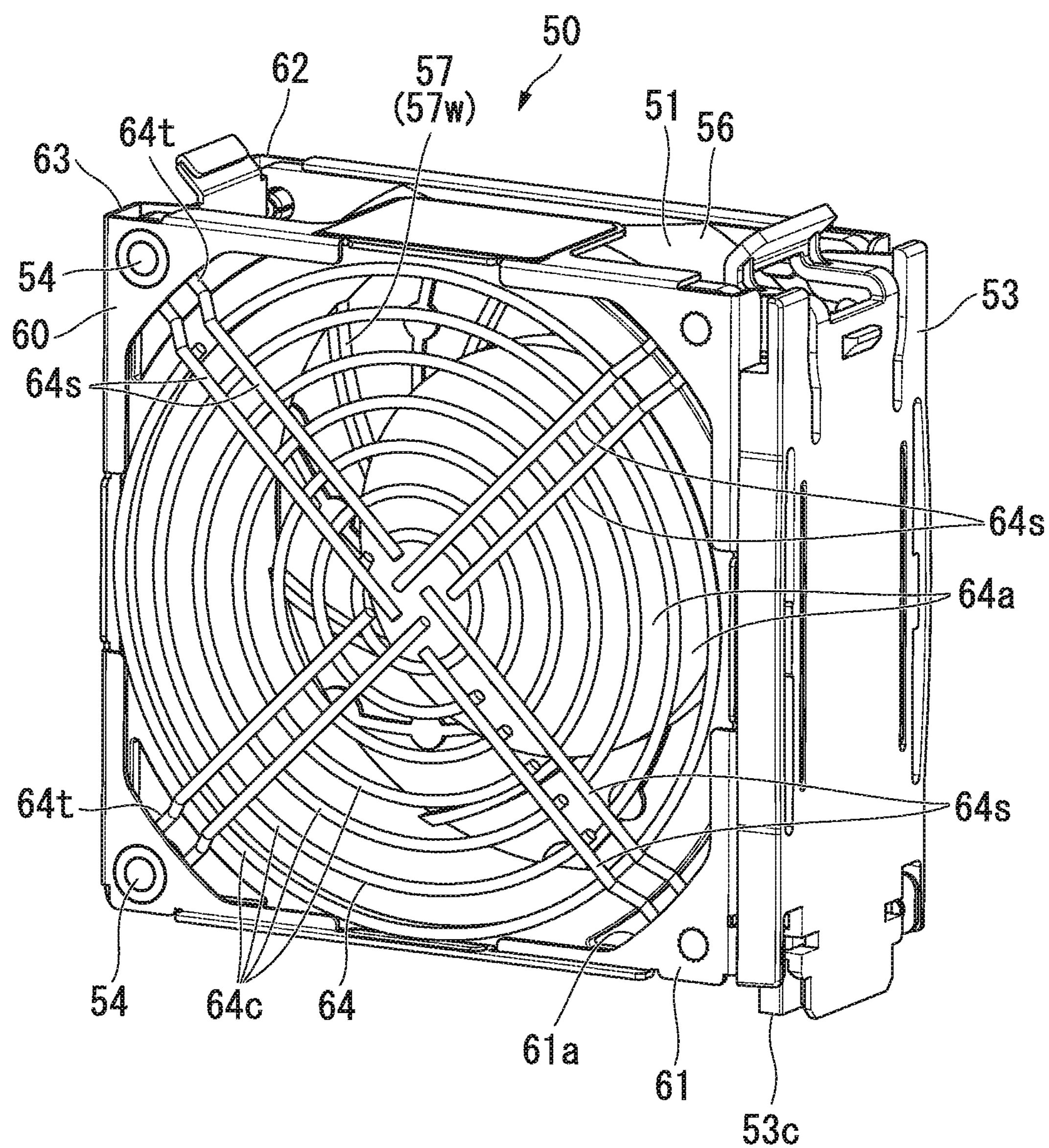
FIG. 3 is a perspective view of a fan module as the cooling device, which is viewed from the intake side.
Figure 4:
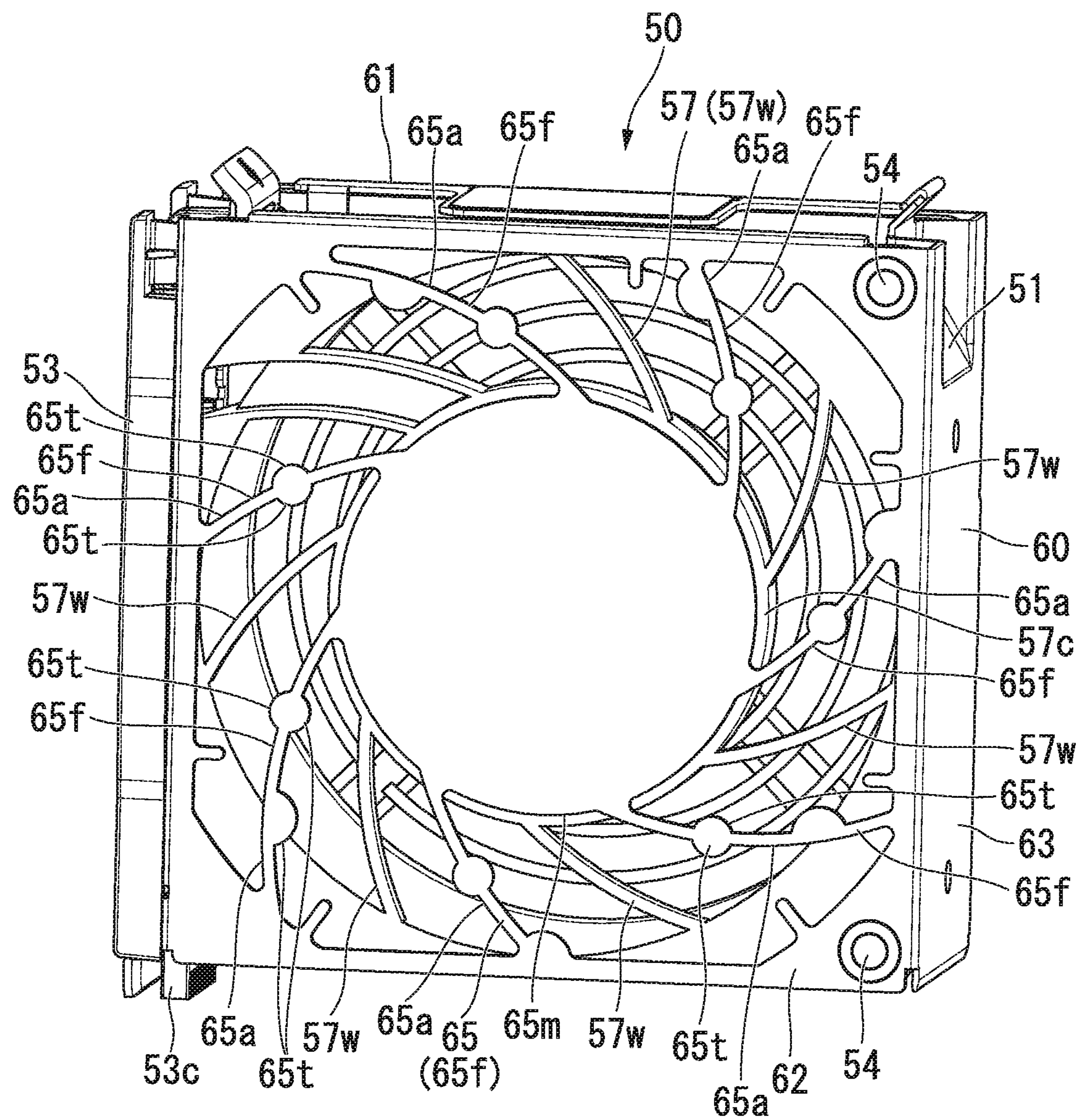
FIG. 4 is a perspective view of the fan module that is viewed from the exhaust side.
Figure 5:
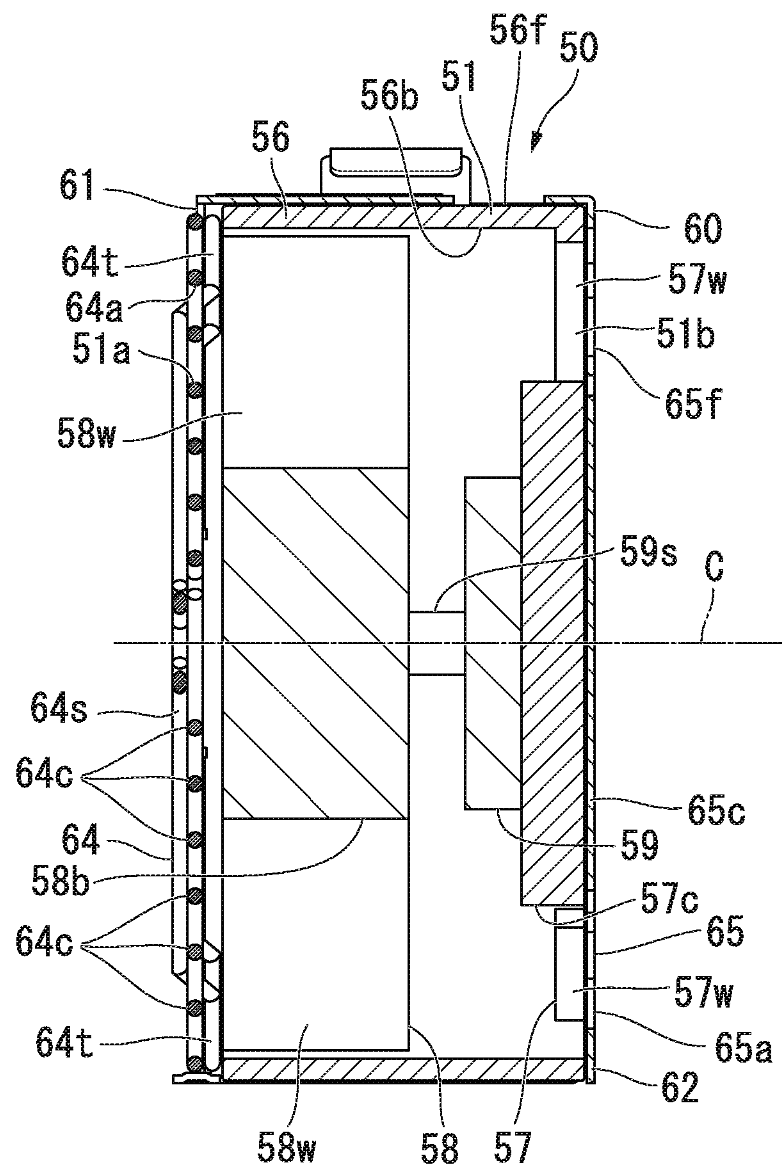
FIG. 5 is a sectional view of the fan module along the rotating shaft thereof.
Figure 6:
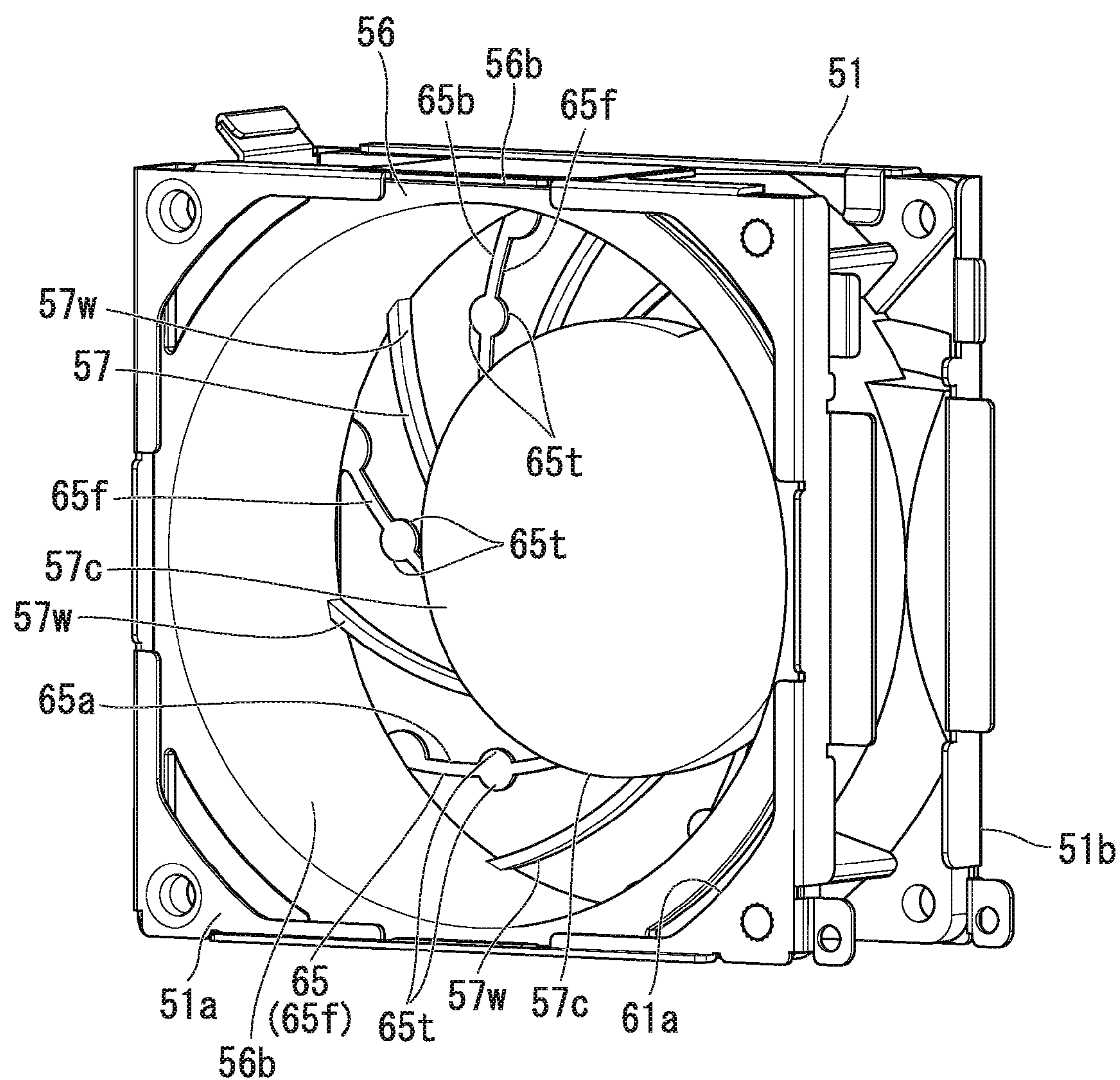
FIG. 6 is a perspective view showing an outer frame member and stator blades as constituents of the fan module.

FIG. 3 is a perspective view of each fan module 50 in the present embodiment, which is viewed from the intake side. FIG. 4 is a perspective view of each fan module 50 in the present embodiment, which is viewed from the exhaust side. FIG. 5 is a sectional view of each fan module 50 along the rotating shaft thereof. FIG. 6 is a perspective view showing an outer frame member and stator blades as constituents of the fan module 50.

As shown in FIGS. 3 to 5, the fan module 50 has a fan unit 51 (i.e., fan), a guard unit 60, and a side plate 53.

The fan unit 51 has an outer-peripheral frame portion 56, a stator blade member 57, and a rotor blade member 58 (see FIG. 5).

As shown in FIGS. 5 and 6, the outer-peripheral frame portion 56 may be made of resin and has a cylindrical shape extending along a rotation axis direction C (see FIG. 5) so as to connect an intake side 51*a* and an exhaust side 51*b* of the fan unit 51. When the outer-peripheral frame portion 56 is viewed from a direction along the rotation axis direction C, for the general outer shape thereof, an outer-peripheral surface 56*f* has a rectangular section and an inner-peripheral surface 56*b* has a circular cross section.

The stator blade member 57 may be made of resin and is integrally molded with the outer-peripheral frame portion 56 at the exhaust side 51*b*, that is, a first end side of the rotation axis direction C. The stator blade member 57 has a disc-shaped boss part 57*c* formed at a center portion thereof and a plurality of stator blades 57*w* provided on the outer-peripheral side of the boss part 57*c* at regular intervals in the circumferential direction. Each stator blade 57*w* is formed to connect the boss part 57*c* to the outer-peripheral frame portion 56.

As shown in FIG. 5, the rotor blade member 58 is arranged inside the outer-peripheral frame portion 56 at the intake side 51*a*, that is, a second end side of the rotation axis direction C in contrast to the stator blade member 57. The rotor blade member 58 has a boss part 58*b* formed at a center portion thereof and a plurality of rotor blades 58*w* provided on the outer-peripheral side of the boss part 58*b* at regular intervals in the circumferential direction, where the boss part 58*b* and the rotor blades 58*w* are integrally formed. The boss part 58*h* of the rotor blade member 58 is connected to a rotating shaft 59*s* of a motor 59 that is fastened to the boss part 57*c* of the stator blade member 57. The rotor blade member 58 rotates around the rotation axis direction C together with the rotating shaft 59*s*, which is rotationally driven by the motor 59, so as to generate an airflow (flow of a fluid) that flows from the intake side 51*a* to the exhaust side 51*b*.

Figure 7:
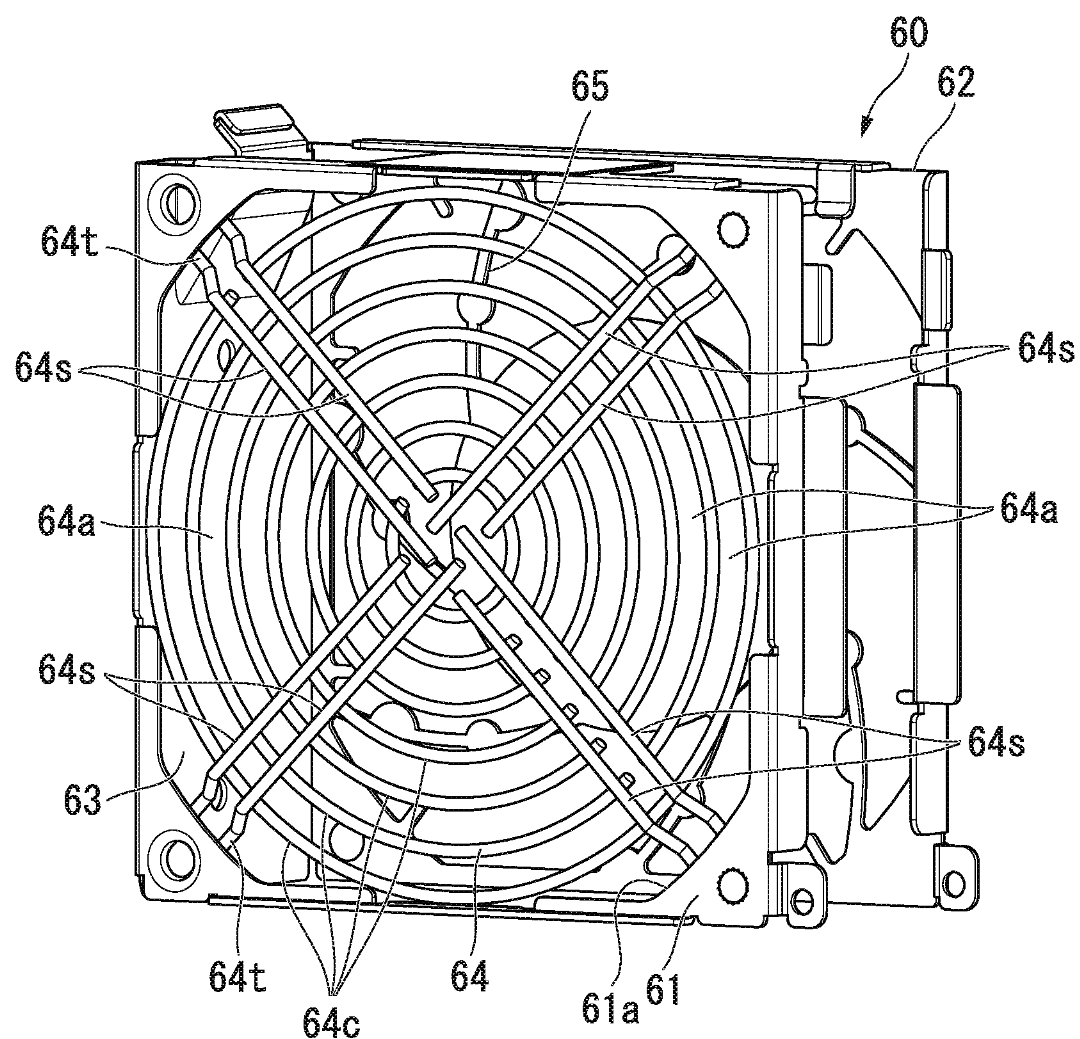
FIG. 7 is a perspective view showing the guard unit as a constituent of the fan module.

FIG. 7 is a perspective view showing the guard unit 60.

As shown in FIGS. 3, 4, and 7, the guard unit 60 is formed by processing a metal plate through a bending process and a punching process by using a press machine or the like. The guard unit 60 includes an intake-side plate part 61 and an exhaust-side plate part 62 (frame part), which face each other with an interval therebetween; a connection plate part 63 which connects the intake-side plate part 61 and the exhaust-side plate part 62; an intake-side intrusion-preventing member 64; and an exhaust-side intrusion-preventing member 65, where these parts are integrally formed.

As shown in FIGS. 3 and 4, the intake-side plate part 61 and the exhaust-side plate part 62 are respectively provided along the intake side 51*a* and the exhaust side 51*b* of the fan unit 51 and are fastened to the outer-peripheral frame portion 56 by using screws 54.

As shown in FIG. 7, the intake-side plate part 61 has an opening 61*a* in a center portion thereof, where the opening 61*a* is arranged closer to the outer-peripheral side than the inner-peripheral surface 56*b* of the outer-peripheral frame portion 56. The intake-side intrusion-preventing member 64 is provided at the intake-side plate part 61.

Figure 8:
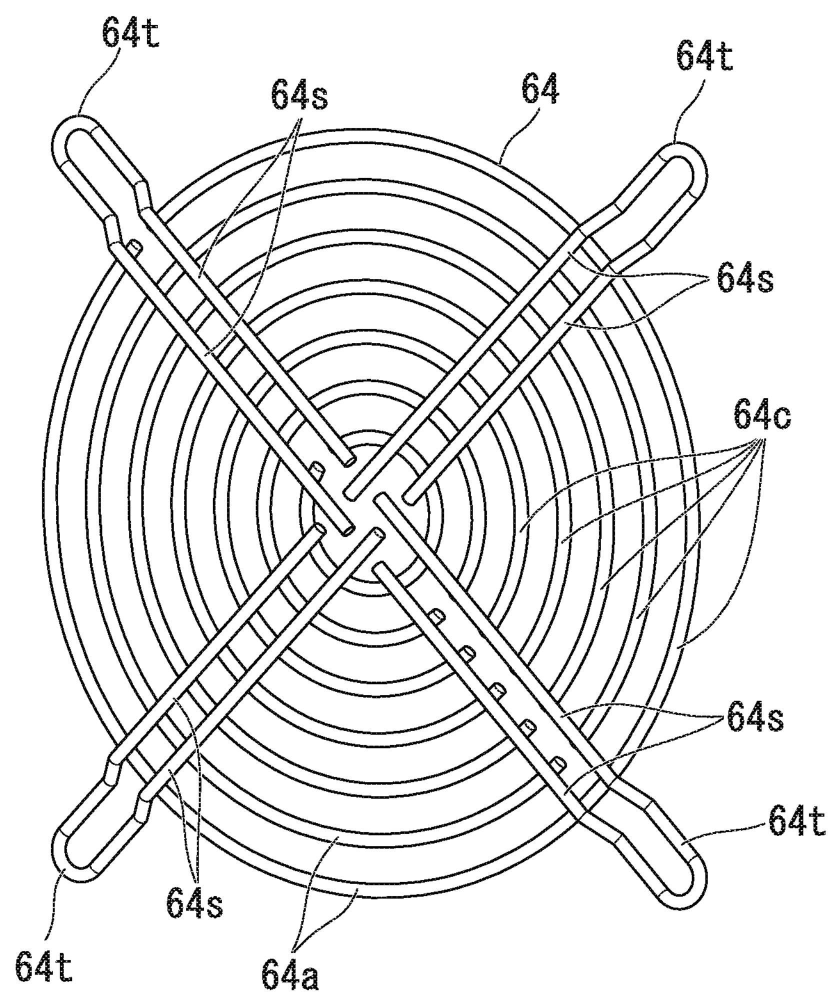
FIG. 8 is a perspective view showing the intake-side intrusion-preventing member as a constituent of the fan module.

FIG. 8 is a perspective view showing the intake-side intrusion-preventing member 64.

As shown in FIG. 8, the intake-side intrusion-preventing member 64 has (i) a plurality of circular parts 64*c* which are concentric with the central axis of the rotating shaft 59*s* when the member 64 is viewed from the rotation axis direction C of the fan unit 51, and (ii) spoke parts 64*s* which extend in radial directions and connects the circular parts 64*c*. The circular parts 64*c* and spoke parts 64*s* which form the intake-side intrusion-preventing member 64 are formed by using, for example, a wire having a circular cross section and made of metal such as steel, stainless steel, or the like.

As shown in FIGS. 3 and 5, in the above intake-side intrusion-preventing member 64, the circular parts 64*c* are formed in the same plane as the intake-side plate part 61 and inside the opening 61*a*. Inside the opening 61*a*, in comparison with the circular parts 64*c* and the intake-side plate part 61, the spoke parts 64*s* protrude outward along the rotation axis direction C. As also shown in FIG. 8, the spoke parts 64*s* have protruding portions 64*t* that protrude from the circular parts 64*c* to the outer-peripheral side. The protruding portions 64*t* are bent at the outer-peripheral side of the circular parts 64*c* toward the inner side along the rotation axis direction C, and are interposed and fastened between the intake-side plate part 61 and the outer-peripheral frame portion 56.

Accordingly, the intake-side intrusion-preventing member 64 is provided on the intake side 51*a* which is an upstream side of the airflow generated when the rotor blade member 58 of the fan unit 51 is rotationally driven, so as to prevent an object having a size greater than or equal to a predetermined value from entering the fan unit 51.

As shown in FIG. 4, at the exhaust-side plate part 62, a motor cover part 65*m* and frame parts 65*f* are formed as the exhaust-side intrusion-preventing member 65.

As shown in FIGS. 4 and 5, the motor cover part 65*m* is arranged in a manner such that it overlaps the motor 59 fastened at a center portion of the stator blade member 57 when viewed from the rotation axis direction C. The frame parts 65*f* are provided at regular intervals in the circumferential direction, and each frame part 65*f* extends from the motor cover part 65*m* toward the outer-peripheral side. In this exhaust-side intrusion-preventing member 65, at the outer-peripheral side of the motor cover part 65*m*, an opening 65*a* is formed between any two frame parts 65*f* adjacent to each other in the circumferential direction.

At each frame part 65*f*, one or more protruding parts 65*t* are integrally formed in a plane perpendicular to the rotation axis direction C so as to narrow the relevant openings 65*a*. The protruding part 65*t* may have a semicircular shape that protrudes from the frame part 65*f*.

The above motor cover part 65*m*, frame parts 65*f*, and protruding parts 65*t* are formed by punching the exhaust-side plate part 62 made of a metal plate so as to generate the openings 65*a*.

The above exhaust-side intrusion-preventing member 65 is provided on the exhaust side 51*b* which is a downstream side of the airflow generated when the rotor blade member 58 of the fan unit 51 is rotationally driven, so as to prevent an object having a size greater than or equal to a predetermined value from entering the fan unit 51.

Here, as shown in FIGS. 4 and 6, the frame parts 65*f* of the exhaust-side intrusion-preventing member 65 are arranged at offset positions from the stator blades 57*w* of the stator blade member 57 in the circumferential direction, in order that at least part of the frame parts 65*f* does not overlap the stator blades 57*w* when viewed from the rotation axis direction C.

Accordingly, since the stator blades 57*w* are positioned in the opening areas of the openings 65*a*, the stator blades 57*w* and the frame parts 65*f* prevent an object from intruding into the rotor blade member 58.

In addition, as shown in FIG. 4, the side plate 53 is interposed between the intake-side plate part 61 and the exhaust-side plate part 62 on the opposite side of the connection plate part 63 in the guard unit 60. At the side plate 53, a connector part 53*c* is provided, to which wiring for the motor 59 is connected. The connector part 53*c* protrudes downward. When the fan module 50 is installed inside the housing 41, the connector part 53*c* is connected to a connector provided on the bottom of the housing 41 so as to supply electric power to the motor 59.

In the above fan module 50, the intake-side intrusion-preventing member 64 and the exhaust-side intrusion-preventing member 65 have different shapes.

More specifically, the arrangement, the shape, and the number of the openings 64*a* of the intake-side intrusion-preventing member 64 differ from those of the openings 65*a* of the exhaust-side intrusion-preventing member 65, so that the intake-side intrusion-preventing member 64 and the exhaust-side intrusion-preventing member 65 have different sectional shapes along the rotation axis direction C of the fan unit 51.

Additionally, in comparison with the intake-side intrusion-preventing member 64 formed by using a wire made of metal, the exhaust-side intrusion-preventing member 65 is formed by punching the exhaust-side plate part 62 made of a metal plate. Accordingly, the intake-side intrusion-preventing member 64 and the exhaust-side intrusion-preventing member 65 have different shapes in a direction perpendicular to the rotation axis direction C of the fan unit 51.

Here, the intake-side intrusion-preventing member 64 and the exhaust-side intrusion-preventing member 65 each prevent an object such as a foreign object, a user's finger or hand, a tool, or the like, from entering the fan unit 51. The intake-side intrusion-preventing member 64 and the exhaust-side intrusion-preventing member 65 respectively have openings 64*a* and openings 65*a*, where the size of each opening is smaller than the size of an object assumed as a target of the intrusion prevention.

On the intake side 51*a* of the fan unit 51, reduction of air passage resistance or the like may be given priority. Therefore, at the intake-side intrusion-preventing member 64, the air passage resistance is reduced by forming the concentric circular parts 64*c* by using a wire having a circular cross section.

In contrast, on the exhaust side 51*b* of the fan unit 51, the air passage resistance is given lower priority than the intake side if a required amount of the airflow is secured, and cost reduction, slimming, or the like, is given higher priority. Accordingly, the exhaust-side intrusion-preventing member 65 is formed by punching the exhaust-side plate part 62 made of a metal plate so that the exhaust-side intrusion-preventing member 65 is thinner than the intake-side intrusion-preventing member 64 made of a wire.

The fan module 50, specifically, the guard unit 60 has (i) the intake-side intrusion-preventing member 64 which is provided on the intake side 51*a* of the fan unit 51 and prevents an object from entering the fan unit 51, and (ii) the exhaust-side intrusion-preventing member 65 which is provided on the exhaust side 51*b* of the fan unit 51 and prevents an object from entering the fan unit 51, where the intake-side intrusion-preventing member 64 and the exhaust-side intrusion-preventing member 65 have different shapes.

In the above structure, the intake-side intrusion-preventing member 64 and the exhaust-side intrusion-preventing member 65 can have different shapes according to different functions or characteristics required for the intake side 51*a* and the exhaust side 51*b* of the fan unit 51. Therefore, the intake-side intrusion-preventing member 64 and the exhaust-side intrusion-preventing member 65 can each employ an optimum shape according to the function or characteristics required therefor, by which the performance of the fan module 50 can be improved, and cost reduction, downsizing, or the like, of the fan module 50 can be implemented.

In the fan module 50, the shape in a direction perpendicular to the rotation axis direction C of the fan unit 51 differs between the intake-side intrusion-preventing member 64 and the exhaust-side intrusion-preventing member 65. Additionally, the sectional shape along the rotation axis direction C also differs between the intake-side intrusion-preventing member 64 and the exhaust-side intrusion-preventing member 65. Accordingly, between the intake side 51*a* and the exhaust side 51*b* of the fan unit 51, different characteristics can be applied to the intake-side intrusion-preventing member 64 and the exhaust-side intrusion-preventing member 65.

In addition, in the fan module 50, the intake-side intrusion-preventing member 64 is formed by using a wire which is made of metal and has a circular cross section. Accordingly, in comparison that the intake-side intrusion-preventing member 64 is made of resin, individual parts of the intake-side intrusion-preventing member 64 can be thinner while securing a required strength, which can reduce the air passage resistance.

Additionally, in the fan module 50, when viewed from the rotation axis direction C of the fan unit 51, the intake-side intrusion-preventing member 64 has the circular parts 64*c* which are concentric with the rotation axis. Accordingly, the air passage resistance at the intake-side intrusion-preventing member 64 can be reduced and pressure loss at the intake side 51*a* of the fan unit 51 can be limited.

Furthermore, in the fan module 50, the exhaust-side intrusion-preventing member 65 has the exhaust-side plate part 62 formed by using a plate member made of metal, and the plurality of the openings 65*a* are formed in the exhaust-side plate part 62.

Accordingly, since the exhaust-side intrusion-preventing member 65 is formed by using a plate member made of metal, the thickness thereof can be smaller than that of the intake-side intrusion-preventing member 64 in the rotation axis direction C. Therefore, downsizing of the fan module 50 can be implemented.

In addition, in the fan module 50, the fan unit 51 has the stator blade member 57 that is provided on the exhaust side of the rotor blade member 58 and includes the plurality of the stator blades 57*w* at regular intervals in the circumferential direction, where intrusion of an object into the rotor blade member 58 is prevented by the stator blades 57*w* and the frame parts 65*f* of the exhaust-side intrusion-preventing member 65.

Since intrusion is prevented by both the stator blades 57*w* and the frame parts 65*f* as described above, the size of the openings 65*a* formed in the exhaust-side plate part 62 can be large. Therefore, pressure loss at the exhaust-side intrusion-preventing member 65 can be reduced.

Furthermore, in the fan module 50, at least part of the frame parts 65*f* of the exhaust-side intrusion-preventing member 65 does not overlap the stator blades 57*w* when viewed from the rotation axis direction C of the rotor blade member 58.

Since the frame parts 65*f* are positioned so as not to overlap the stator blades 57*w* as described above, the size of openings generated by the stator blades 57*w* and the exhaust-side plate part 62 can be reduced, and thus intrusion of an object into the fan unit 51 can be effectively prevented. Additionally, since the size of the openings 65*a* of the exhaust-side intrusion-preventing member 65 can be large, pressure loss at the exhaust-side intrusion-preventing member 65 can be limited.

In addition, in the fan module 50, the exhaust-side intrusion-preventing member 65 has (i) the motor cover part 65*m* positioned in a manner such that it overlaps the motor 59 when viewed along the rotation axis direction of the rotor blade member 58, and (ii) the frame parts 65*f* which extend from the motor cover part 65*m* to the outer-peripheral side of the member 65. Therefore, the exhaust-side intrusion-preventing member 65 can cover the motor 59.

The exhaust side of the fan unit 51 has the motor 59 in a center portion thereof and the airflow generated by the fan unit 51 does not flow in this portion. When the motor cover part 65*m* is arranged at this portion, the motor cover part 65*m* does not function as an element that varies the air passage resistance. Since the frame parts 65*f* extend from such a motor cover part 65*m* toward the outer-peripheral side, the frame parts 65*f* can be short. Therefore, it is easy to secure a required strength of the frame parts 65*f*, and the thickness of the exhaust-side intrusion-preventing member 65 can be reduced.

Furthermore, in the fan module 50, the exhaust-side intrusion-preventing member 65 has the protruding parts 65*t* at each frame part 65*f*, which extend from the frame part 65*f* into the relevant openings 65*a* so as to narrow the openings 65*a*. Since the openings 65*a* are narrowed by the protruding parts 65*t* which extend toward the inside of the relevant openings 65*a*, it is possible to more effectively prevent an object from entering the fan unit 51.

In the server 40 having the above-described fan module 50, since the intake-side intrusion-preventing member 64 and the exhaust-side intrusion-preventing member 65 have different shapes, the performance of the fan module 50 can be improved, and cost reduction, downsizing, or the like, of the fan module 50 can be implemented. Therefore, the cooling performance in the housing 41 of the server 40 can be improved, and the mounting density of modules and the like in the housing 41 can be improved.

Examination Cases

The shape of the exhaust-side intrusion-preventing member was examined and the results thereof will be shown below.

For the exhaust-side intrusion-preventing member of the fan module, the following two types were examined: a shape when viewed from the rotation axis direction of the fan that is the same as the intake-side intrusion-preventing member 64 of the second embodiment (Examination case 1), and a shape when viewed from the rotation axis direction of the fan that is the same as the exhaust-side intrusion-preventing member 65 of the second embodiment (Examination case 2).

In each of the fan modules having the exhaust-side intrusion-preventing members of Examination cases 1 and 2, the motor 59 was driven by a constant voltage of 12 V and the value of a current which flowed to the motor 59 was measured.

In the results, the current value for the fan module of Examination case 2 was 5.64 A while the current value for the fan module of Examination case 1 was 5.33 A. Accordingly, it was confirmed that when the exhaust-side intrusion-preventing member 65 of the second embodiment is employed as the exhaust-side intrusion-preventing member of the fan module, the air passage resistance for the airflow generated by the motor 59 can be reduced.

In the above second embodiment, the structures of the intake-side intrusion-preventing member 64 and the exhaust-side intrusion-preventing member 65 were shown. However, the shape viewed from the rotation axis direction C and the sectional shape along the rotation axis direction C may be any other shapes. For example, the intake-side intrusion-preventing member 64 is not always made of a wire having a circular cross section, and the sectional shape may be a semicircle, an oval, an ellipse, a polygon, or the like.

In addition, although the fan unit 51 provides a pair of the stator blade member 57 and the rotor blade member 58, two or more pairs thereof may be provided. In such a case, each pair of the stator blade member 57 and the rotor blade member 58 has the intake-side intrusion-preventing member 64 and the exhaust-side intrusion-preventing member 65.

In addition, the structure of the fan unit 51 is not limited. For example, although the stator blade member 57 and the rotor blade member 58 are provided in the second embodiment, only the rotor blade member. 58 may be provided.

Furthermore, the number of the fan modules 50 mounted in the server 40 or arrangement of the fan modules 50 in the server 40 can be appropriately modified.

Additionally, the fan modules 50 may be mounted in a device other than the server 40.

In the second embodiment, a cooling device is a module which is the fan module 50 and is provided in the server 40. However, the cooling device may not be a module and may be implemented as a part of the server.

Other than the above, additions, omissions, substitutions, and modifications for the above-described embodiments can be made without departing from the scope of the present invention. Accordingly, the invention is not to be considered as being limited by the foregoing description, and is only limited by the scope of the appended claims.

Priority is claimed on Japanese Patent Application No. 2015-209990, filed Oct. 26, 2015, the contents of which are incorporated herein by reference.

What is claimed is:

1. A cooling device comprising:

a fan;

an intake-side intrusion-preventing member that is provided on an intake side of the fan and prevents an object from entering the fan;

an exhaust-side intrusion-preventing member that is provided on an exhaust side of the fan and prevents an object from entering the fan, wherein the intake-side intrusion-preventing member and the exhaust-side intrusion-preventing member have different shapes, wherein the fan includes:

a stator blade member provided on an exhaust side of the fan; and a motor arranged in a center portion of the stator blade member and configured to rotate a rotor blade member about a rotation axis of the rotor blade member, and wherein the exhaust-side intrusion-preventing member includes:

a motor cover part overlapping the motor when viewed from a direction along the rotation axis, a plurality of frame parts formed by using a plate member, wherein the plurality of frame parts are provided at intervals with each other in a circumferential direction and extend from the motor cover part to an outer-peripheral side of the exhaust-side intrusion-preventing member, and wherein the plurality of frame parts have an arch shape, and a plurality of protruding parts respectively provided on the plurality of frame parts, wherein each of the plurality of protruding parts protrudes in a direction substantially perpendicular to the rotation axis, and each of the plurality of protruding parts has a semi-circular shape.

2. The cooling device in accordance with claim 1, wherein shapes of the intake-side intrusion-preventing member and the exhaust-side intrusion-preventing member in a direction perpendicular to a rotation axis of the fan are different.

3. The cooling device in accordance with claim 1, wherein sectional shapes of the intake-side intrusion-preventing member and the exhaust-side intrusion-preventing member in a rotation axis direction of the fan are different.

4. The cooling device in accordance with claim 1, wherein the intake-side intrusion-preventing member is formed by using a wire which is made of metal and has a circular cross section.

5. The cooling device in accordance with claim 1, wherein when viewed from a rotation axis direction of the fan, the intake-side intrusion-preventing member includes a plurality of circular parts which are concentric with a rotation axis of the fan.

6. The cooling device in accordance with claim 1, wherein:

the plate member is made of metal; and a plurality of openings are formed in the frame parts.

7. The cooling device in accordance with claim 6, wherein:

the stator blade member includes a plurality of stator blades provided at intervals in the circumferential direction; and the stator blades and the frame parts prevent intrusion of an object into the rotor blade member.

8. The cooling device in accordance with claim 7, wherein when viewed from the direction along the rotation axis of the rotor blade member, at least part of the frame parts of the exhaust-side intrusion-preventing member does not overlap the stator blades.

9. The cooling device in accordance with claim 7, wherein the protruding parts protrude from the frame parts into the openings so as to narrow the openings.

10. A guard unit provided on an intake-side and an exhaust-side of a fan, the fan including a stator blade member and a motor, the stator blade member being provided on the exhaust-side of the fan, and the motor being arranged in a center portion of the stator blade member and being configured to rotate a rotor blade member about a rotation axis of the rotor blade member, the guard unit comprising:

an intake-side intrusion-preventing member that is provided on an upstream side of a flow direction of a fluid generated when the fan is driven, where the intake-side intrusion-preventing member prevents an object having a size greater than or equal to a predetermined value from entering the fan;

an exhaust-side intrusion-preventing member that is provided on a downstream side of the flow direction and is spaced apart from the intake-side intrusion-preventing member, where the exhaust-side intrusion-preventing member prevents an object having a size greater than or equal to a predetermined value from entering the fan;

wherein the intake-side intrusion-preventing member and the exhaust-side intrusion-preventing member have different shapes, and wherein the exhaust-side intrusion-preventing member includes:

a motor cover part overlapping the motor when viewed from a direction along the rotation axis, a plurality of frame parts formed by using a plate member, wherein the plurality of frame parts are provided at intervals with each other in a circumferential direction and extend from the motor cover part to an outer-peripheral side of the exhaust-side intrusion-preventing member, and wherein the plurality of frame parts have an arch shape, and a plurality of protruding parts respectively provided on the plurality of frame parts, wherein each of the plurality of protruding parts protrudes in a direction substantially perpendicular to the rotation axis, and each of the plurality of protruding parts has a semi-circular shape.

11. A server comprising the cooling device in accordance with claim 1.

* * * * *